United States Patent
Yun et al.

(10) Patent No.: US 12,068,176 B2
(45) Date of Patent: Aug. 20, 2024

(54) APPARATUS AND METHOD OF MANUFACTURING SOLDER BUMP

(71) Applicant: Samsung Electronics Co., Ltd., Suwon-si (KR)

(72) Inventors: Sungyong Yun, Hwaseong-si (KR); Sanghoon Lee, Seongnam-si (KR); Sungil Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/063,029

(22) Filed: Dec. 7, 2022

(65) Prior Publication Data

US 2023/0104577 A1    Apr. 6, 2023

Related U.S. Application Data

(63) Continuation of application No. 17/012,624, filed on Sep. 4, 2020, now Pat. No. 11,551,944.

(30) Foreign Application Priority Data

Sep. 6, 2019    (KR) .................. 10-2019-0110771

(51) Int. Cl.
  *H01L 21/67* (2006.01)
  *H01L 23/00* (2006.01)
(52) U.S. Cl.
  CPC ........ *H01L 21/67098* (2013.01); *H01L 24/11* (2013.01); *H01L 24/13* (2013.01)
(58) Field of Classification Search
  CPC .................................................... H01L 24/11
  See application file for complete search history.

(56) References Cited

U.S. PATENT DOCUMENTS

| 5,345,061 A | * | 9/1994 | Chanasyk | B23K 1/008 219/400 |
| 5,358,166 A | * | 10/1994 | Mishina | B23K 1/008 228/232 |
| 5,766,979 A | * | 6/1998 | Budnaitis | H01L 23/49866 438/118 |
| 5,886,535 A | * | 3/1999 | Budnaitis | G01R 1/07314 29/830 |
| 5,896,038 A | * | 4/1999 | Budnaitis | G01R 31/2863 324/754.18 |

(Continued)

FOREIGN PATENT DOCUMENTS

| JP | H 06-226437 A | 8/1994 |
| KR | 10-2004-0024062 A | 3/2004 |

(Continued)

OTHER PUBLICATIONS

Wei Lin et al., "Study of Fluxless Soldering Using Formic Acid Vapor" IEEE Transactions of Advanced Packaging, vol. 22, No. 4, Nov. 1999.

(Continued)

*Primary Examiner* — William A Harriston
(74) *Attorney, Agent, or Firm* — Harness, Dickey & Pierce, P.L.C.

(57) ABSTRACT

An apparatus for forming a solder bump on a substrate including a supporter configured to support the substrate to be provided thereon, a housing surrounding the supporter, a cover defining a manufacturing space in combination with the housing and including an edge heating zone along a perimeter thereof, the manufacturing space surrounding the supporter, and an oxide remover supply nozzle configured to supply an oxide remover to the manufacturing space may be provided.

18 Claims, 10 Drawing Sheets

(56) References Cited

U.S. PATENT DOCUMENTS

| | | | |
|---|---|---|---|
| 5,966,022 A * | 10/1999 | Budnaitis | G01R 31/2865 |
| | | | 324/750.05 |
| 7,134,199 B2 | 11/2006 | Su et al. | |
| 11,551,944 B2 * | 1/2023 | Yun | H01L 24/11 |
| 2004/0211675 A1 * | 10/2004 | Dong | C23G 5/00 |
| | | | 257/E21.252 |
| 2005/0255685 A1 * | 11/2005 | Zhang | B23K 1/008 |
| | | | 438/612 |
| 2007/0099411 A1 * | 5/2007 | Matsui | H01L 24/742 |
| | | | 438/106 |
| 2007/0123020 A1 * | 5/2007 | Jungnickel | H01L 24/05 |
| | | | 257/E21.508 |
| 2008/0078145 A1 * | 4/2008 | Tu | B23K 1/008 |
| | | | 53/404 |
| 2008/0128476 A1 * | 6/2008 | Wang | H01L 24/11 |
| | | | 228/256 |
| 2009/0184152 A1 * | 7/2009 | Kimbara | H05K 3/3494 |
| | | | 228/1.1 |
| 2011/0318918 A1 * | 12/2011 | Kitamura | H01L 24/13 |
| | | | 438/613 |
| 2014/0209662 A1 * | 7/2014 | Ngai | F27D 17/008 |
| | | | 134/4 |
| 2017/0203377 A1 * | 7/2017 | Yokoyama | H01L 21/67103 |
| 2018/0090345 A1 | 3/2018 | Kouzuma et al. | |

FOREIGN PATENT DOCUMENTS

| | | |
|---|---|---|
| KR | 10-2007-0047679 A | 5/2007 |
| KR | 10-1332295 | 11/2013 |
| KR | 10-2014-0064227 A | 5/2014 |
| KR | 10-1547319 | 8/2015 |
| KR | 10-1733586 | 5/2017 |

OTHER PUBLICATIONS

Korean Office Action dated Jun. 27, 2024 issued in Korean Patent Application No. 10-2019-0110771.

* cited by examiner

APPARATUS AND METHOD OF MANUFACTURING SOLDER BUMP

CROSS-REFERENCE TO RELATED APPLICATION

This application is a continuation of U.S. application Ser. No. 17/012,624, filed on Sep. 4, 2020, which claims priority under 35 U.S.C. § 119 to Korean Patent Application No. 10-2019-0110771, filed on Sep. 6, 2019, in the Korean Intellectual Property Office, the disclosure of each of which is incorporated herein in its entirety by reference.

BACKGROUND

The inventive concepts relate to apparatuses and/or methods of manufacturing a solder bump, and more particularly, to apparatuses and/or methods of manufacturing a solder bump, which decrease product defects and enhance productivity.

Fluxless solder bumps using no flux may be applied to wafer level packages. In solder bump reflow apparatuses for reflowing the solder bumps, particles can be easily deposited therein and dropped onto a substrate which is to be processed, thereby causing product defects.

SUMMARY

The inventive concepts provide apparatuses for manufacturing a solder bump, which decreases product defects and enhances productivity.

The inventive concepts provide methods of manufacturing a solder bump, which decreases product defects and enhances productivity.

According to an example embodiment of the inventive concepts, an apparatus for forming a solder bump on a substrate may include a supporter configured to support the substrate to be provided thereon, a housing surrounding the supporter, a cover defining a manufacturing space in combination with the housing, the manufacturing space surrounding the supporter, and an oxide remover supply nozzle configured to supply an oxide remover to the manufacturing space, wherein the cover includes an edge heating zone along a perimeter of the cover.

According to an example embodiment of the inventive concepts, an apparatus for forming a solder bump on a substrate may include a supporter configured to support the substrate including the solder bump thereon, a housing surrounding the supporter, a cover defining a manufacturing space in combination with the housing, the manufacturing space surrounding the supporter, and an oxide remover supply nozzle configured to supply an oxide remover to the manufacturing space to remove oxide from a surface of the solder bump, wherein the cover includes a first inner surface substantially parallel to a surface of the substrate and a second inner surface substantially perpendicular to the surface of the substrate, and the first inner surface and the second inner surface are connected to each other by a third inner surface therebetween at a corner region of the cover, the third inner surface of the cover having a curve surface with a first radius of curvature.

According to an example embodiment of the inventive concepts, an apparatus for forming a solder bump on a substrate, the apparatus including a fluxless reflow apparatus for reflowing a solder bump, may include a supporter configured to support the substrate, a housing surrounding the supporter, a cover defining a manufacturing space in combination with the housing, the manufacturing space surrounding the supporter, and an oxide remover supply nozzle configured to supply an oxide remover to the manufacturing space, wherein the cover includes an edge heating zone along a perimeter of the cover.

According to an example embodiment of the inventive concepts, a method of forming a solder bump may include providing a substrate including a solder bump on a supporter in a reflow space, the reflow space defined by a housing and a cover, applying energy to an edge heating zone provided along a perimeter of the cover, supplying an oxide remover onto the substrate, and heating the substrate to reflow the solder bump.

BRIEF DESCRIPTION OF THE DRAWING

Example embodiments of the inventive concepts will be more clearly understood from the following detailed description taken in conjunction with the accompanying drawings in which.

DETAILED DESCRIPTION

While the term "same" or "identical" is used in description of example embodiments, it should be understood that some imprecisions may exist. Thus, when one element (or a value or a direction (e.g., "parallel" or "perpendicular") is referred to as being the same as another element, it should be understood that an element (or a value or a direction) is the same as another element (or another value or another direction) within a desired manufacturing or operational tolerance range (e.g., ±10%).

When the terms "about" or "substantially" are used in this specification in connection with a numerical value or a direction, it is intended that the associated numerical value or direction includes a manufacturing or operational tolerance (e.g., ±10%) around the stated numerical value or direction. Moreover, when the words "generally" and "substantially" are used in connection with geometric shapes, it is intended that precision of the geometric shape is not required but that latitude for the shape is within the scope of the disclosure. Further, regardless of whether numerical values, directions, or shapes are modified as "about" or "substantially," it will be understood that these values, directions, or shapes should be construed as including a manufacturing or operational tolerance (e.g., ±10%) around the stated numerical values, directions, or shapes.

Figure 1:
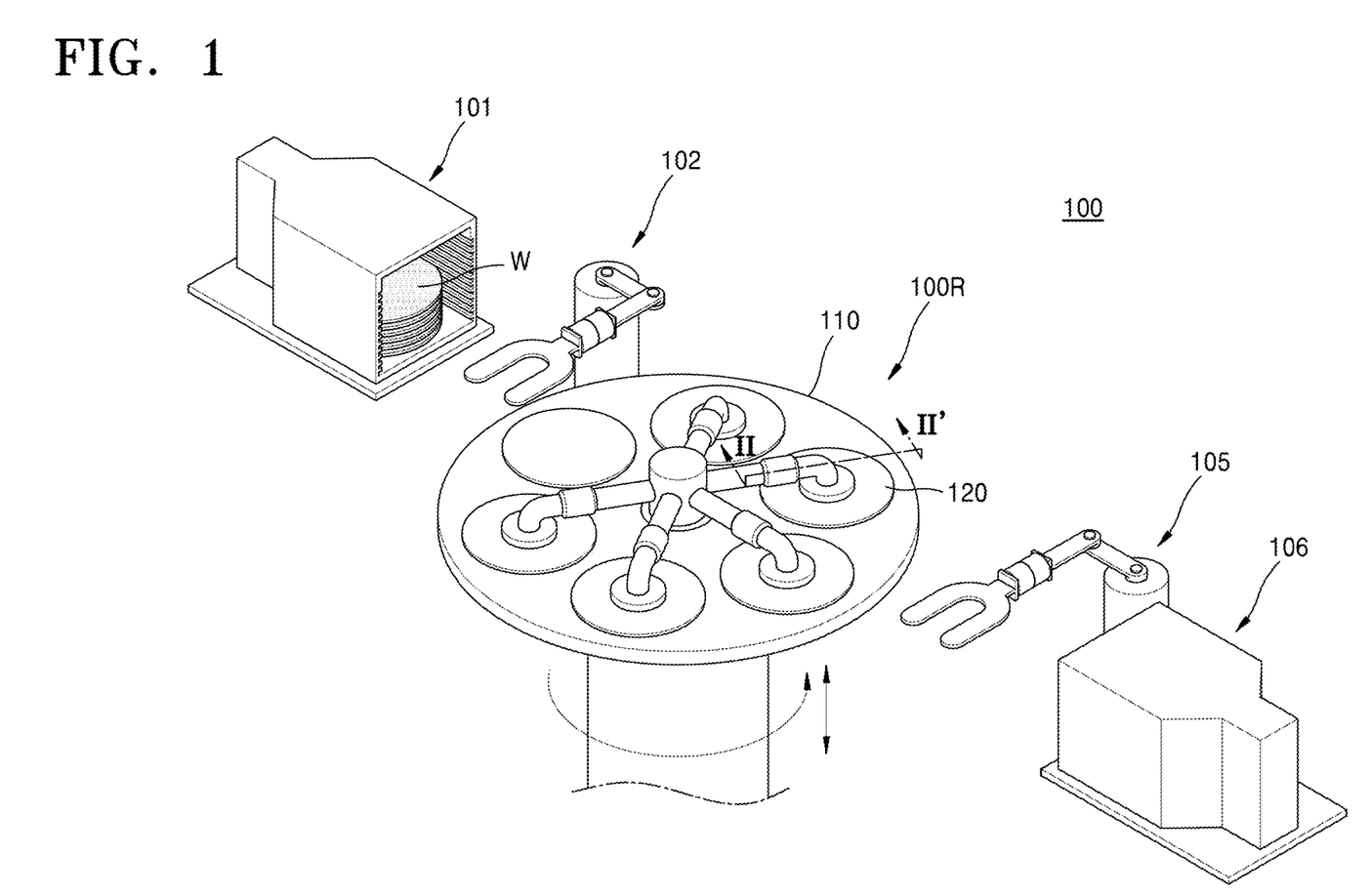
FIG. 1 is a perspective view for describing an apparatus for manufacturing a solder bump, according to an example embodiment.

FIG. 1 is a perspective view for describing an apparatus for manufacturing a solder bump, according to an example embodiment. In some example embodiments, an apparatus (hereinafter referred to as a solder bump manufacturing apparatus) for manufacturing a solder bump may denote an apparatus for manufacturing a solder bump through a reflow process, but is not limited thereto. Therefore, it may be understood by those of ordinary skill in the art that 'a solder bump manufacturing apparatus' described below is an example of a solder bump manufacturing apparatus and 'a reflow space' is an example of a manufacturing space where a solder bump is formed.

Referring to FIG. 1, a solder bump reflow apparatus 100 may include a loading part 101, a first transfer device 102, a reflow region 100R, a second transfer device 105, and an unloading part 106.

The loading part 101 may provide a space for accommodating a plurality of substrates W, which are to be loaded into the reflow region 100R. The loading part 101 may accommodate the plurality of substrates W in a state where an active surface of each of the substrates to be processed faces upward. In some example embodiments, the loading part 101 may be provided in plurality.

The first transfer device 102 may transfer a substrate W, accommodated into the loading part 101, to the reflow region 100R. In some example embodiments, the first transfer device 102 may be, for example, a robot arm including a blade-type end effector.

The reflow region 100R may include a plurality of processing spaces for processing the plurality of substrates W. In FIG. 1, the reflow region 100R is illustrated as including six processing spaces, but is not limited thereto and may include more or fewer processing spaces than six. In some example embodiments, the reflow region 100R may rotate based on a processing state of a substrate W.

Each of the plurality of processing spaces may include a housing 110 and a cover 120, and the cover 120 defines a reflow space in combination with the housing 110. The substrate may be accommodated or transported into the reflow space and may be reflow-processed. The reflow space may be opened or closed through a relative motion of the cover 120 and the housing 110. In some example embodiments, the cover 120 may be raised, and then, the substrate W may be loaded into the reflow space. In some example embodiments, the cover 120 may be lowered, and then, the substrate may be loaded into the reflow space.

The second transfer device 105 may transfer a substrate W, on which reflow processing is completed in the reflow region 100R, to the unloading part 106. The second transfer device 105, like the first transfer device 102, may be a robot arm including a blade-type end effector.

The unloading part 106 may provide a space for accommodating the plurality of substrates W each including a bump and having undergone a bump reflow process, unloaded from the reflow region 100R.

Figure 2:
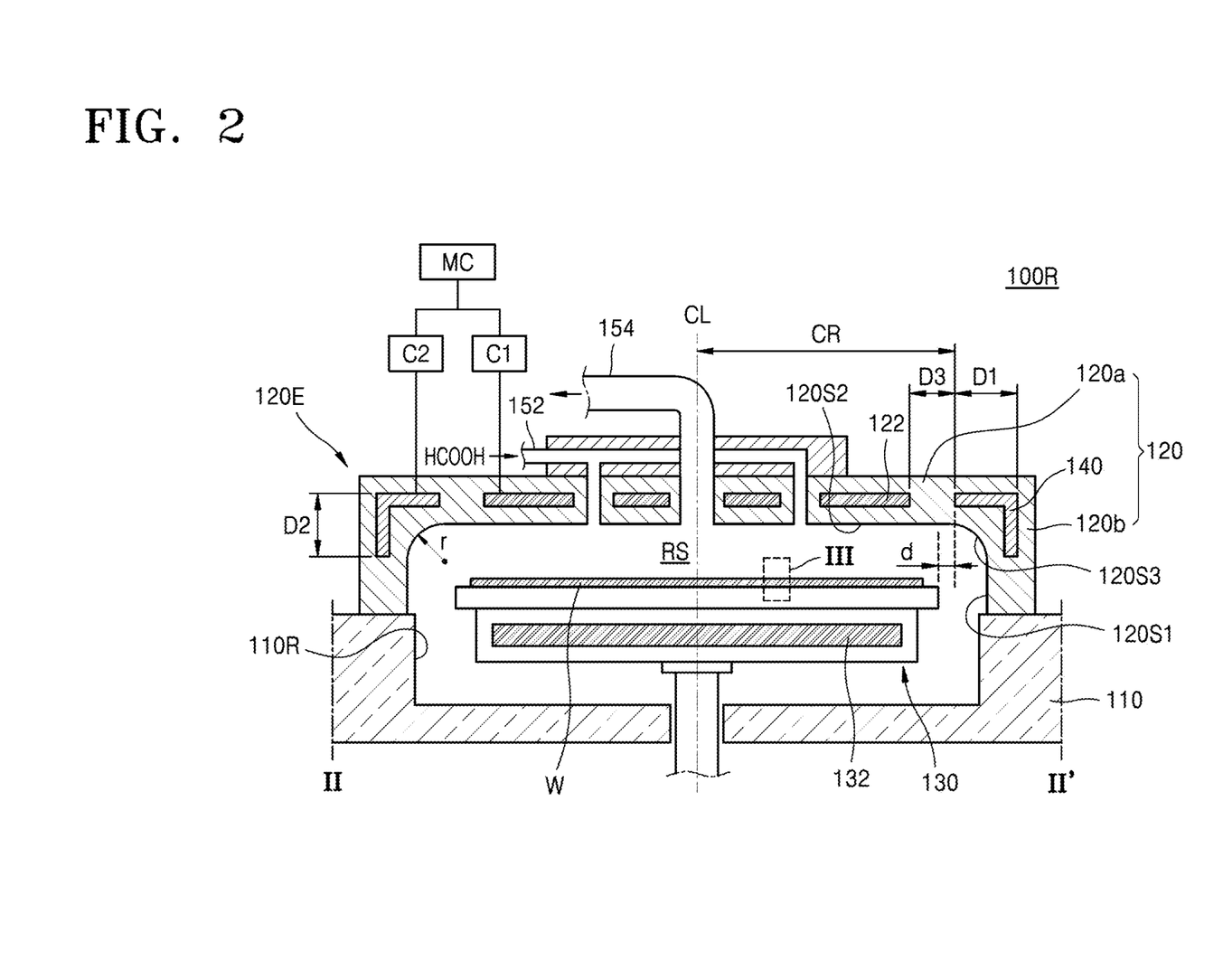
FIG. 2 is a partial cross-sectional view taken along line II-II' of FIG. 1.

FIG. 2 is a partial cross-sectional view taken along line II-II' of FIG. 1.

Referring to FIG. 2, the reflow region 100R may include a supporter 130 configured to support a substrate W to be provided thereon and a housing 110 and a cover 120, which surround the supporter 130. The cover 120 may define a reflow space RS surrounding the supporter 130 in combination with the housing 110.

Figure 3:
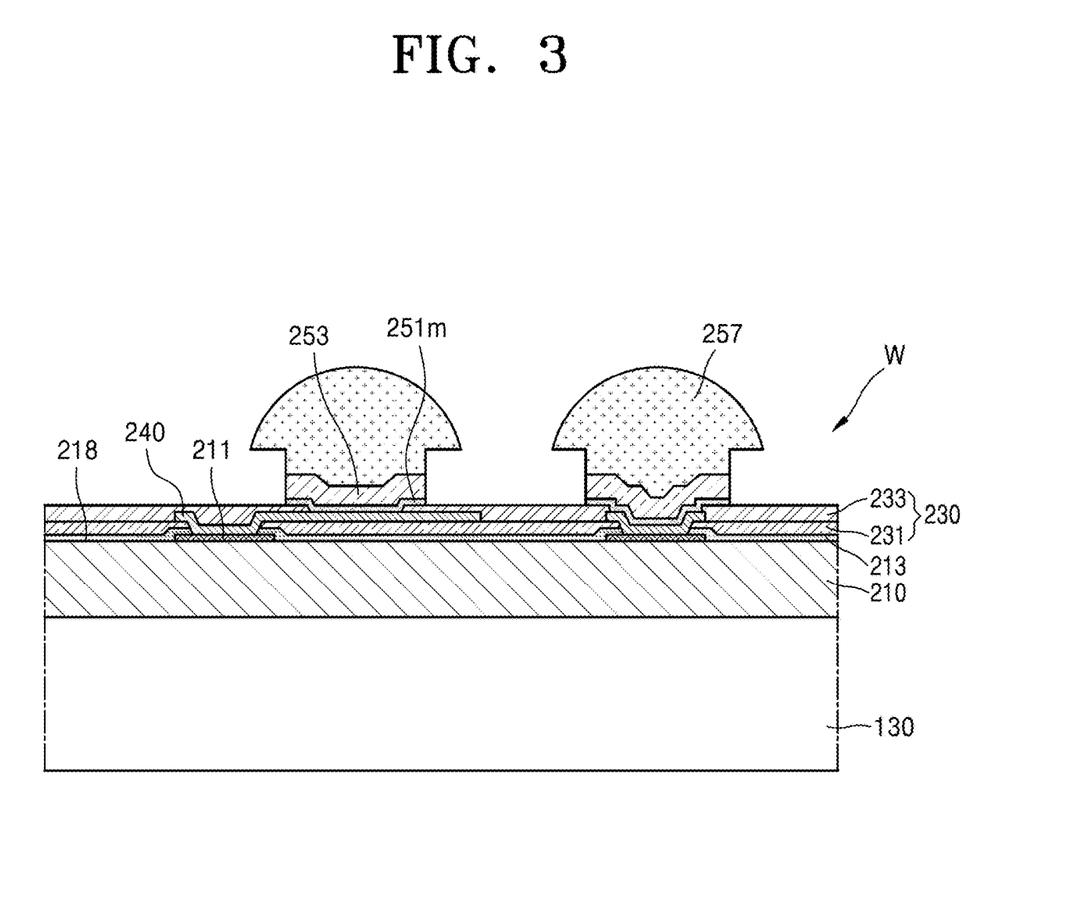
FIG. 3 is a partially enlarged view of a region III of FIG. 2.

FIG. 3 is a partially enlarged view of a region III of FIG. 2.

Referring to FIG. 3, a substrate W may be disposed on a supporter 130. The substrate W may include a passivation layer 213 and a first insulation pattern 231, which are disposed on a first surface 218 of a semiconductor substrate 210 to expose a chip pad 211. Also, a wiring pattern 240 for redistribution may be provided on the first insulation pattern 231, and a second insulation pattern 233 for insulating the wiring pattern 240 may be provided on the first insulation pattern 231.

The second insulation pattern 233 may expose a portion of the wiring pattern 240. A seed metal layer 251m may be formed on the wiring pattern 240 exposed by the second insulation pattern 233, and an under-bump metal 253 and a solder bump 257 may be formed therefrom.

Although not shown in FIG. 3, a mask layer for exposing a position at which the under-bump metal 253 and the solder bump 257 are to be formed may be provided before forming the under-bump metal 253 and the solder bump 257. The under-bump metal 253 and the solder bump 257 may be formed on the seed metal layer 251m exposed by the mask layer through an electroplating process or an electroless plating process. In this case, the solder bump 257 may grow at an exposed position and beyond a top of the mask layer, and thus, as illustrated in FIG. 3, may have a cross-sectional shape having a mushroom shape. Subsequently, the mask layer may be removed, and the seed metal layer 251m and the under-bump metal 253, which are exposed after removing the mask layer, may be removed, and thus, the substrate W with the solder bump 257 provided thereon may be obtained as in FIG. 3.

As illustrated in FIG. 3, because flux is not used for attaching the solder bump 257 on the substrate W, a solder bump formed through such a process may be referred to as a fluxless solder bump.

The first insulation pattern 231, the second insulation pattern 233, and the passivation layer 213 each may include, for example, one or more materials of silicon nitride, silicon oxide, or silicon oxynitride.

The seed metal layer 251m, the wiring pattern 240, and the chip pad 211 may each include an arbitrary conductive material. For example, the seed metal layer 251m, the wiring pattern 240, and the chip pad 211 each may include tungsten (W), copper (Cu), zirconium (Zr), titanium (Ti), tantalum (Ta), aluminum (Al), ruthenium (Ru), palladium (Pd), platinum (Pt), cobalt (Co), nickel (Ni), or a combination thereof.

The under-bump metal 253 may include Ti, Cu, chromium (Cr), W, Ni, Al, Pd, gold (Au), or a combination thereof.

The solder bump 257 may include a metal alloy including tin (Sn) as a main component. For example, the solder bump 257 may include an alloy of Sn and one or more materials of silver (Ag), indium (In), bismuth (Bi), antimony (Sb), Cu, zinc (Zn), or lead (Pb). In some example embodiments, the solder bump 257 may include an alloy which includes 3 wt % Ag, 0.5 wt % Cu, and residual Sn.

A solder bump having a mushroom shape in a cross-sectional as illustrated in FIG. 3 may be reflowed to have a ball shape by the solder bump reflow apparatus 100.

Referring again to FIG. 2, the substrate W may be supported by the supporter 130. The substrate W may be disposed on the supporter 130 so that an active surface thereof faces upward. The substrate W may be fixed to the supporter 130 by, for example, vacuum or electrostatic attraction.

A supporter heating part 132 for heating the substrate W may be provided in the supporter 130. In some example embodiments, the supporter heating part 132 may be heated at a temperature of about 220° C. to about 280° C. for heating the substrate W.

In some example embodiments, the supporter 130 may be configured to rotate for uniformly heating the substrate W.

The housing 110 may include a recess 110R, which accommodates the supporter 130 and at least partially surrounds the supporter 130.

The cover 120 may be provided on the supporter 130. The cover may be at a position higher than a position of the housing 110. The cover 120 may define a reflow space RS surrounding the supporter 130 along with the housing 110.

In some example embodiments, the cover 120 may include a first portion 120a, which is substantially parallel to a surface (e.g., top surface) of the substrate W (or the supporter 130), and a second portion 120b, which is substantially perpendicular to the surface of the substrate W (or the supporter 130). In some example embodiments, the first portion 120a being substantially parallel to the surface of the substrate W may denote that an angle between an arbitrary portion of the first portion 120a and the surface of the substrate W is about 0 degrees to about 30 degrees. In some example embodiments, the second portion 120b being substantially perpendicular to the surface of the substrate W may denote that an angle between an arbitrary portion of the second portion 120b and the surface of the substrate W is about 70 degrees to about 90 degrees.

In some example embodiments, an angle between the first portion 120a and the second portion 120b may be about 80 degrees to about 140 degrees. In some example embodiments, an angle between the first portion 120a and the second portion 120b may be about 85 degrees to about 100 degrees. In some example embodiments, an angle between the first portion 120a and the second portion 120b may be about 90 degrees.

The reflow region 100R may include an oxide remover supply nozzle 152 for supplying an oxide remover to the reflow space RS so as to remove oxide from a surface of the solder bump 257. The oxide remover may be, for example, formic acid (HCOOH). The oxide remover supply nozzle 152 may be coupled to the cover 120.

The solder bump 257 may include a composition including Sn as a main component as described above, and a surface of the solder bump 257 may include native oxide including tin oxide as a main component. Because the tin oxide decreases sphericity which represents how close a solder bump is to a sphere after reflow, a process of removing the tin oxide may be performed before reflow or simultaneously with reflow.

Figure 4:
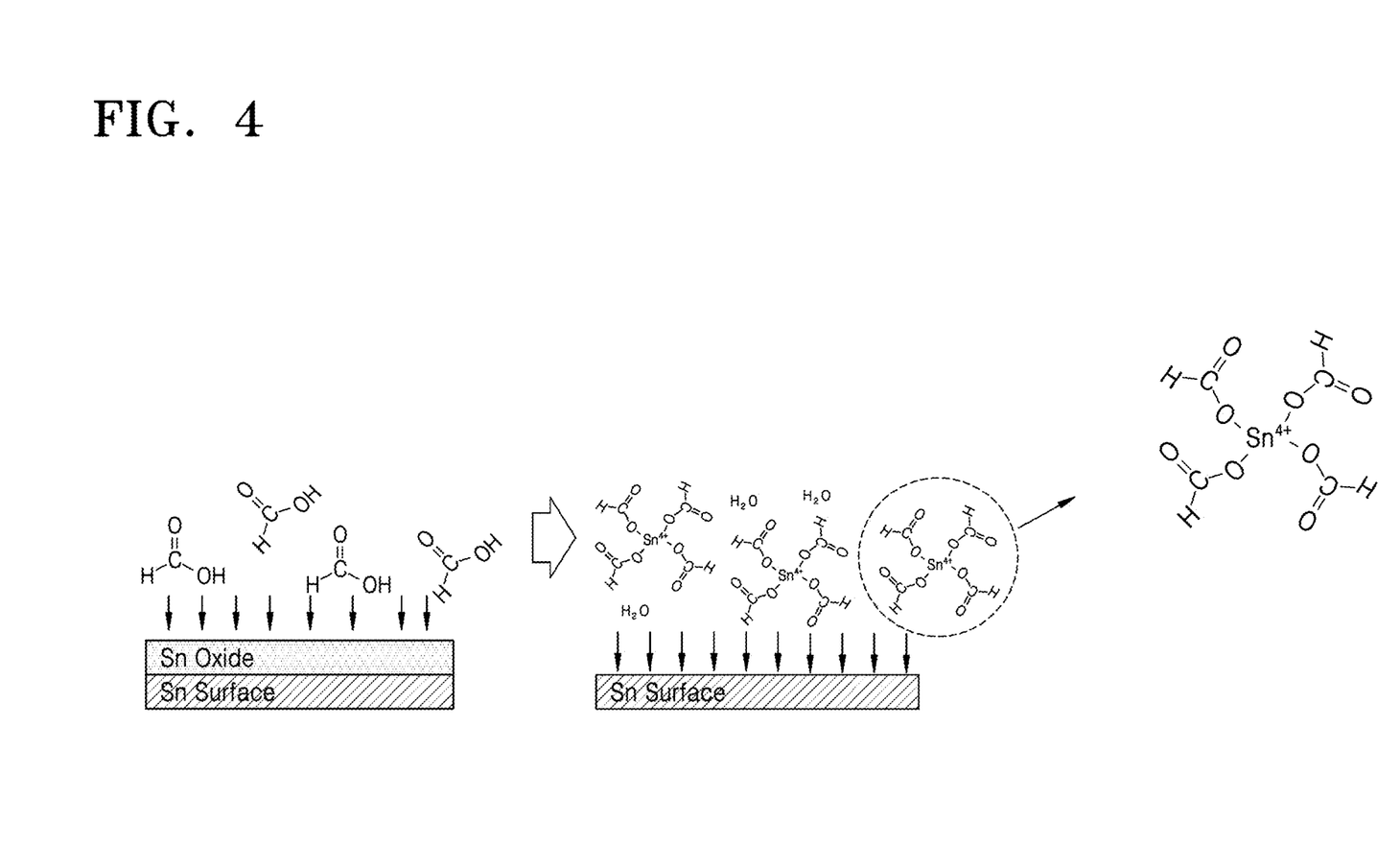
FIG. 4 is a conceptual view illustrating the principle that tin oxide is removed by formic acid.

FIG. 4 is a conceptual view illustrating the principle that tin oxide is removed by formic acid.

Referring to FIG. 4, tin oxide may be formed on a surface of a solder bump including tin as a main component. The tin oxide may be native oxide that is natively formed by oxygen in air.

When a gaseous formic acid is provided to a surface of the tin oxide, $Sn(COOH)_4$, which is an organic metal compound, may be generated as a result of a reaction between the tin oxide and the formic acid. The present disclosure is not intended to bind the inventive concepts to a specific theoretical principle, however, a reaction between metal oxide and formic acid may be formulated as follows, according to a temperature condition (herein, Me may denote metal).

(when a temperature is higher than about 150° C.)

$$MeO+2HCOOH \rightarrow Me(COOH)_2+H_2O$$

(when a temperature is higher than about 200° C.)

$$Me(COOH)_2 \rightarrow Me+CO_2+H_2$$

$$H_2+MeO \rightarrow Me+H_2O$$

When the reaction formula is applied to tin oxide, $Sn(COOH)_4$, which is an organic metal compound, may be generated based on the following reaction formula.

$$SnO_2+4HCOOH \rightarrow Sn(COOH)_4+2H_2O$$

$Sn(COOH)_4$, which is the organic metal compound generated in this manner, may not be deposited on an inner surface of the cover 120, and may be discharged through a discharge nozzle 154 above a certain temperature. The discharge nozzle 154 may be located at a central portion of the cover 120 and configured to discharge the organic metal compound to an outside of the reflow space RS. In some example embodiments, a heater (not shown) may be provided at an elbow portion of the discharge nozzle 154 so as to mitigate or prevent the organic metal compound from being deposited on the elbow portion.

Internal pressure of the reflow space RS may be generally maintained to be equal to atmospheric pressure, and a flow rate may be controlled to maintain balance between the oxide remover (for example, formic acid) supplied through the oxide remover supply nozzle 152 and a reaction product discharged through the discharge nozzle 154. In some example embodiments, the oxide remover may be supplied to the reflow space RS together with an inert carrier gas. The inert carrier gas may be, for example, a gas which is low in activity like nitrogen, or is inert like helium, neon, and argon.

Because a temperature of a corner portion (or an edge portion) 120E of the cover 120 is relatively low compared to the other portion(s) of the cover 120, an organic metal compound is easily deposited on an inner surface of the edge portion 120, and the organic metal compound, which has been deposited and accumulated, may fall onto a substrate W, thereby causing product defects.

[Edge Heating Zone]

Referring again to FIG. 2, the cover 120 may include an edge heating zone 140, which is provided along a perimeter of the cover 120. As described above, because the organic metal compound may be easily deposited on the edge portion 120E of the cover 120 when a temperature of the edge portion 120E of the cover 120 is relatively low, the edge heating zone 140 may be provided along the perimeter of the cover 120 to increase the temperature of the edge portion 120E of the cover 120, thereby decreasing or preventing deposition of the organic metal compound.

In some example embodiments, the edge heating zone 140 may be provided in a ring shape along the perimeter of the cover 120. The edge heating zone 140 may be, for example, a resistive heater using a heating wire including a metal material (e.g., tungsten (W) or rhenium (Re)) an induction heater using an inductive coil, but example embodiments are not limited thereto.

In some example embodiments, the edge heating zone 140 may include an inverted-L-shaped cross-sectional. A portion of the edge heating zone 140 may include a first portion 120a extending in a horizontal direction, which is substantially parallel to a surface of the substrate W. Further, the edge heating zone 140 may include a second portion 120b extending in a perpendicular direction, which is substantially perpendicular to the surface of the wafer W.

In some example embodiments, when the edge heating zone 140 is projected onto a plane including the supporter 130, the projection of the edge heating zone 140 may not overlap the supporter 130. Further, when the edge heating zone 140 is projected onto the plane including the supporter 130, the projection of the edge heating zone 140 may have a ring shape.

As illustrated in FIG. 2, when the edge heating zone 140 is projected onto the plane including the supporter 130, an inner circumference portion of the edge heating zone 140 may be apart from an outer circumference portion of the supporter 130 by an interval (or distance) d. In other words, the edge heating zone 140 may be spaced apart from the supporter 130 by the interval of d, when viewed from a plan view, such that an inner circumference portion of the edge heating zone 140 may be apart from an outer circumference portion of the supporter 130 by the interval d In some example embodiments, the interval d may be about 1 mm to about 5 mm, or may be about 2 mm to about 4 mm.

Because the projection of the edge heating zone 140 does not overlap the supporter 130, interference caused by an operation of the edge heating zone 140 in reflow processing of the substrate W, which is performed by the supporter 130, may be reduced or prevented.

For example, when the interval d is too small, the operation of the edge heating zone 140 may interfere in the reflow processing of the substrate W. For example, when the interval d is too large, a space may be wasted and the manufacturing cost may increase.

In some example embodiments, the edge heating zone 140 may include a portion which extends in a radius direction of the supporter 130 in the first portion 120a. In some example embodiments, a length D1 by which a first portion 120a of the edge heating zone 140 extends in the radius direction of the supporter 130 and may be about 20 mm to about 100 mm, about 30 mm to about 80 mm, or about 35 mm to about 65 mm. In some example embodiments, the length D1 by which the edge heating zone 140 extends in the radius direction of the supporter 130 in the first portion 120a may be about 45 mm.

For example, when the length D1 is too large, the edge heating zone 140 may overlap a central heating part 122 of a central region CR to be described below, and due to this, energy may be undesirably wasted. Further, when the length D1 is too small, a heating effect of the edge heating zone 140 may be reduced, thereby causing a reduction in an effect of preventing or mitigating deposition of an organic metal compound.

In some example embodiments, the edge heating zone 140 may include an edge heating portion in the second portion 120b and extending in a direction substantially perpendicular to the surface of the supporter 130. In some example embodiments, a length D2 of the edge heating portion may be about 10 mm to about 50 mm, about 15 mm to about 45 mm, or about 20 mm to about 40 mm. In some example embodiments, the length D2 may be about 34 mm.

For example, when the length D2 is too large, the edge heating zone 140 may overlap the supporter heating part 132 described above, and thus energy may be undesirably wasted. Further, when the length D2 is too small, the heating effect of the edge heating zone 140 may be reduced, thereby causing a reduction in an effect of mitigating or preventing deposition of an organic metal compound.

The central heating part 122 provided in the first portion 120a may be apart from the edge heating zone 140 by a first distance D3. In some example embodiments, a shortest distance between the central heating part 122 and the edge heating zone 140 may be the first distance D3. The first distance D1 may be, for example, about 1 mm to about 50 mm, about 2 mm to about 45 mm, about 3 mm to about 40 mm, about 4 mm to about 30 mm, or about 5 mm to about 20 mm.

The central heating part 122 may be controlled by a first controller C1. The edge heating zone 140 may be controlled by a second controller C2. In some example embodiments, the first controller C1 and the second controller C2 may be controlled by a master controller MC in cascade. In some example embodiments, the master controller MC may be omitted. When the master controller MC is omitted, the first controller C1 and the second controller C2 may be independently controlled. The controllers C1, C2 and MC may include processing circuitry such as hardware including logic circuits, a hardware/software combination such as a processor executing software, or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

[Edge Inner Curve Surface Portion]

Figure 5A:
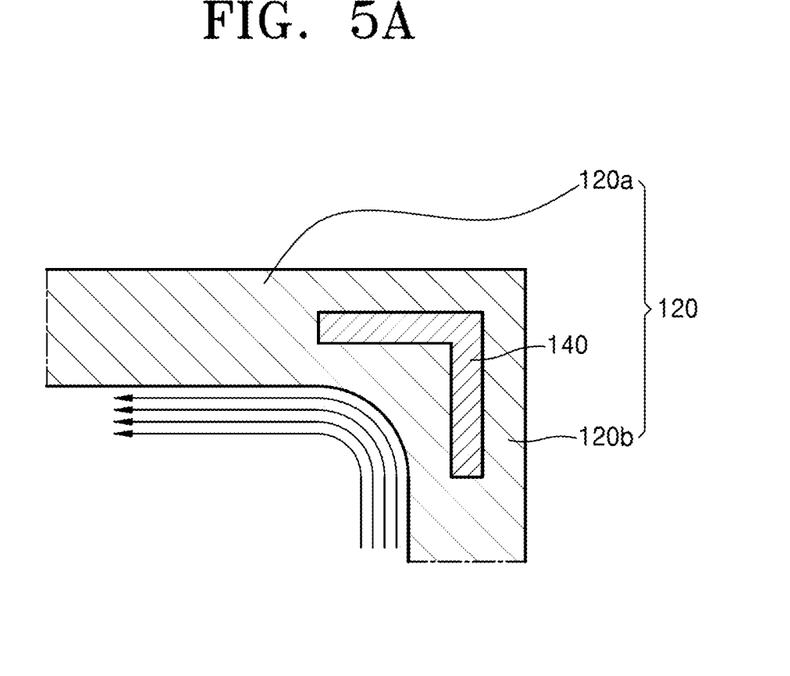
FIG. 5A is a partially enlarged view illustrating a gas flow near an edge heating zone according to an example embodiment.
Figure 5B:
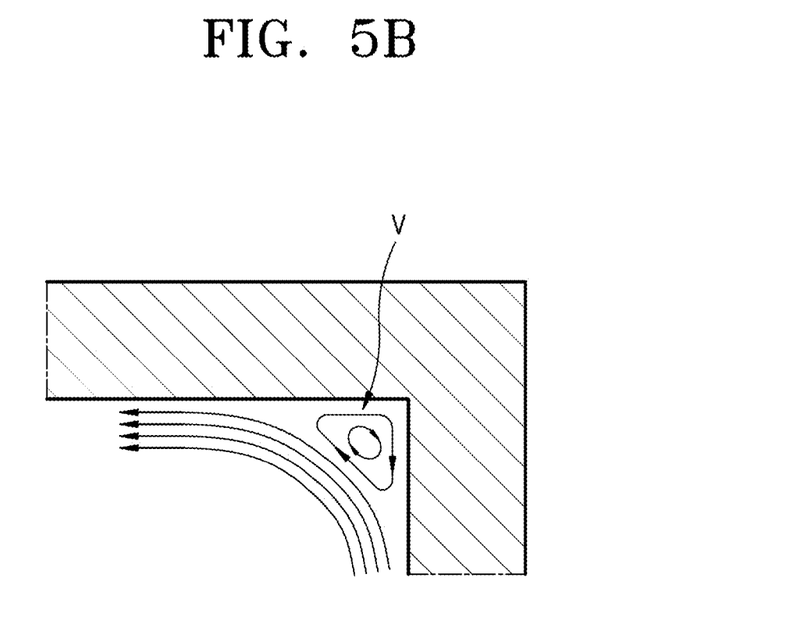
FIG. 5B is a partially enlarged view illustrating a gas flow near a corner region of a cover according to a related art reflow apparatus.

FIG. 5A is a partially enlarged view illustrating a gas flow near an edge heating zone 140 according to an example embodiment. FIG. 5B is a partially enlarged view illustrating a gas flow near a corner region of a cover according to a related art reflow apparatus.

First, referring to FIG. 5B, a horizontal inner surface of the first portion 120a of the cover 120 may be perpendicular to a vertical inner surface of the second portion 102b of the cover 120, and a stagnant zone V may be easily formed near a corner region where the horizontal inner surface meets the vertical inner surface. A vortex where gas swirls may be formed in the stagnant zone V, and heat transfer and mass transfer between the stagnant zone and a bulk zone may be reduced. Further, a temperature of gas may be reduced and a movement speed may be reduced in the stagnant zone V. Under such conditions, an organic metal compound may easily lose momentum thereof and may be deposited at the corner region.

Referring to FIG. 5A, a curve surface portion may be provided in the corner region of the cover 120, and thus a stagnant zone may not be formed unlike FIG. 5B. In other words, the first portion 120a of the cover 120 and the second portion 120b of the cover 120 may be connected to each other at the edge region such that an inner surface of the cover 120 have a curve surface with a first radius of curvature, at the corner region. The present disclosure is not intended to bind the inventive concepts to a specific theoretical principle, however a laminar flow of gas may not form a turbulent flow by the curve surface portion in the corner region. Here, the laminar flow may denote a hydrodynamic flow where lateral-direction mixture does not occur with respect to a flow direction and fluid particles move along a stream line and may have a flow condition having a Reynolds number of about 2,100 or less, about 2,000 or less, or about 1,800 or less.

Therefore, a flow of gas may be maintained at a certain level or more in the corner region without creating a turbulent flow due to a creation of a stagnant zone, and thus, deposition of an organic metal compound may be reduced or prevented. Further, because a flow of gas is active, heat transfer and mass transfer may be relatively smoothly performed in a reflow space, and deposition of the organic metal compound may be reduced or prevented.

Referring back to FIG. 2, the first portion 120a of the cover 120 may include a first inner surface portion 120S2 facing the reflow space RS. The second portion 120b of the cover 120 may include a second inner surface portion 120S1 facing the reflow space RS. Further, the cover 120 may include a third inner surface portion 120S3, which connects the first inner surface portion 120S2 to the second inner surface portion 120S1.

The third inner surface portion 120S3 may be a curve surface having a first radius of curvature r, and the first radius of curvature r may be, for example, about 5 mm to about 27 mm or about 10 mm to about 20 mm. In some example embodiments, the first curvature radius r may be about 15 mm.

In some example embodiments, the first inner surface portion 120S2 may be tangential to the third inner surface portion 120S3 at a point at which the first inner surface portion 120S2 meets the third inner surface portion 120S3. In some example embodiments, the second inner surface portion 120S1 may be tangential to the third inner surface portion 120S3 at a point at which the second inner surface portion 120S1 meets the third inner surface portion 120S3.

In some example embodiments, a cross-sectional surface of the third inner surface portion 120S3 may be an arc, which is a portion of a circle. For example, a vertical cross-sectional surface of the third inner surface portion 120S3, which is cut to pass through a center CL of the cover 120, may be a quarter circle having the first radius of curvature r as a radius.

For example, when the first radius of curvature radius r is too large, it may be difficult to smoothly connect the first inner surface portion 120S2 to the third inner surface portion 120S3 and/or the second inner surface portion 120S1 to the third inner surface portion 120S3. Thus there may be a possibility that an organic metal compound is deposited on an inner surface.

For example, when the first radius of curvature r is too small, an effect obtained by providing the third inner surface portion 120S3 having a curve surface between the first inner surface portion 120S2 and the second inner surface portion 120S1 may be reduced. That is, a stagnant zone may be formed adjacent to the third inner surface portion 120S3, and thus, there may be a possibility that the organic metal compound is deposited on the inner surface.

A flow of gas flowing adjacent to the edge portion 120E of the cover 120, as described above with reference to FIG. 5A, may secure a smooth laminar flow by using the third inner surface portion 120S3, which is a curve surface, and thus, deposition of an organic metal compound on an inner surface may be prevented or reduced. Further, whether the flow of gas maintains a laminar flow may depend on a viscosity of gas at least partially, and because a viscosity of gas depends also on a temperature of the gas, heating the gas through the edge heating zone 140 may contribute to maintain a laminar flow.

A temperature of gas flowing adjacent to the edge heating zone 140 may increase by about 20° C. to about 50° C. due to the edge heating zone 140. That is, when the edge heating zone 140 operates, a temperature of gas adjacent to the third inner surface portion 120S3 may increase by about 20° C. to about 50° C. compared to a case where the edge heating zone 140 does not operate. In other words, the second controller C2 may control a temperature of the edge heating zone 140 such that the temperate adjacent to, for example, the curve surface of the cover 120 increases by 20° C. to about 50° C. The second controller C2 may be controlled by the master controller MC. As described above, the second controller C2 may include processing circuitry such as hardware including logic circuits, a hardware/software combination such as a processor executing software, or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Figure 6:
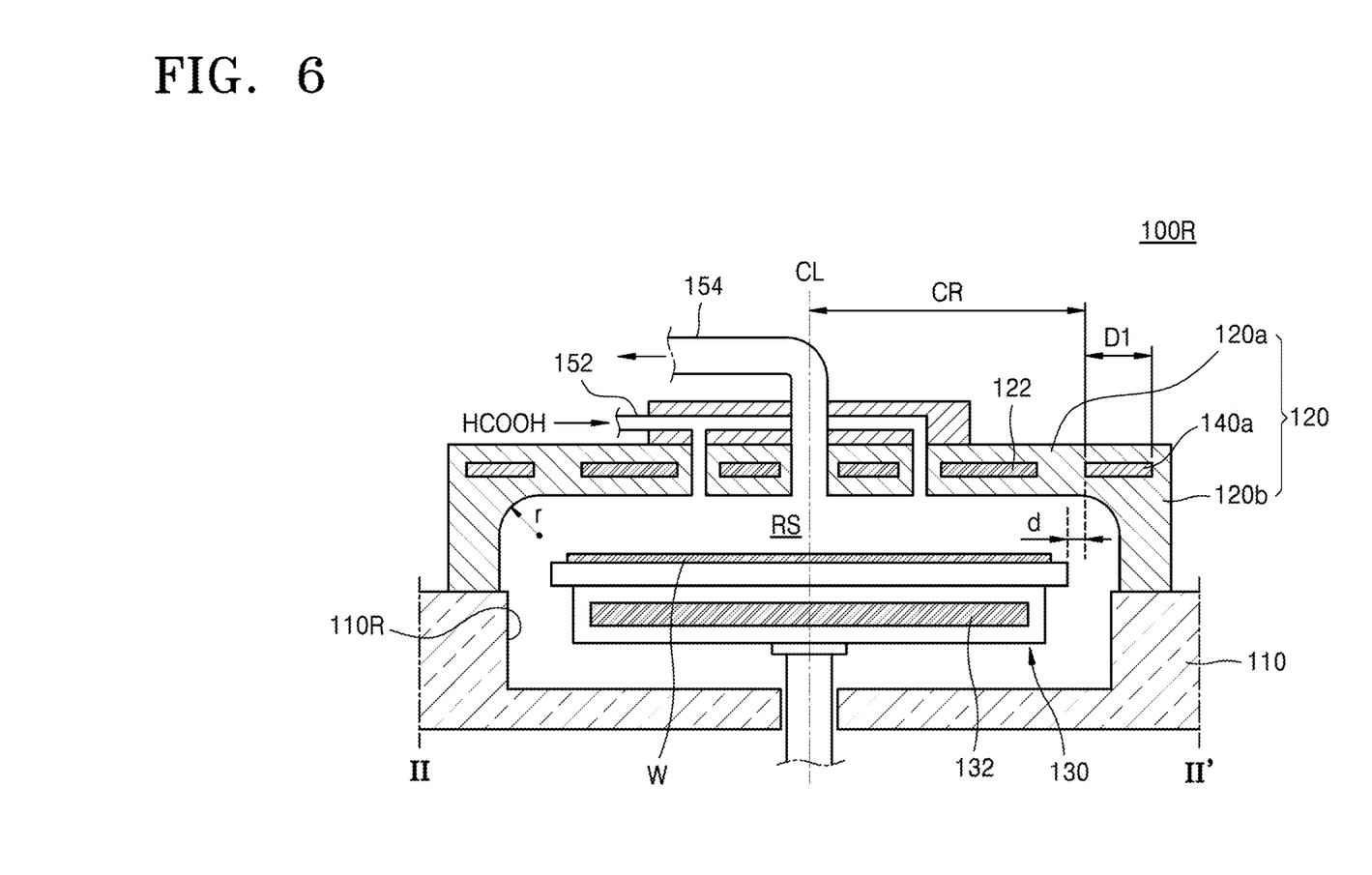
FIG. 6 is a schematic view illustrating a cross-sectional surface of a reflow region of an apparatus for manufacturing a solder bump, according to another example embodiment.

FIG. 6 is a schematic view illustrating a cross-sectional surface of a reflow region 100R of a solder bump reflow apparatus according to another example embodiment. Comparing with the reflow region illustrated in FIG. 2, the reflow region 100R illustrated in FIG. 6 may have a difference in only a cross-sectional shape of an edge heating zone, and the other configuration may be the same. Hereinafter, therefore, such a difference will be mainly described.

Referring to FIG. 6, an edge heating zone may be provided as a horizontal edge heating zone 140a, which extends in a direction substantially parallel to the top surface of the supporter 130 (or the substrate W), and may not include a portion extending in a direction substantially perpendicular to the top surface of the supporter 130 (or the substrate W). Therefore, the horizontal edge heating zone 140a may be disposed in a first portion 120a.

Figure 7:
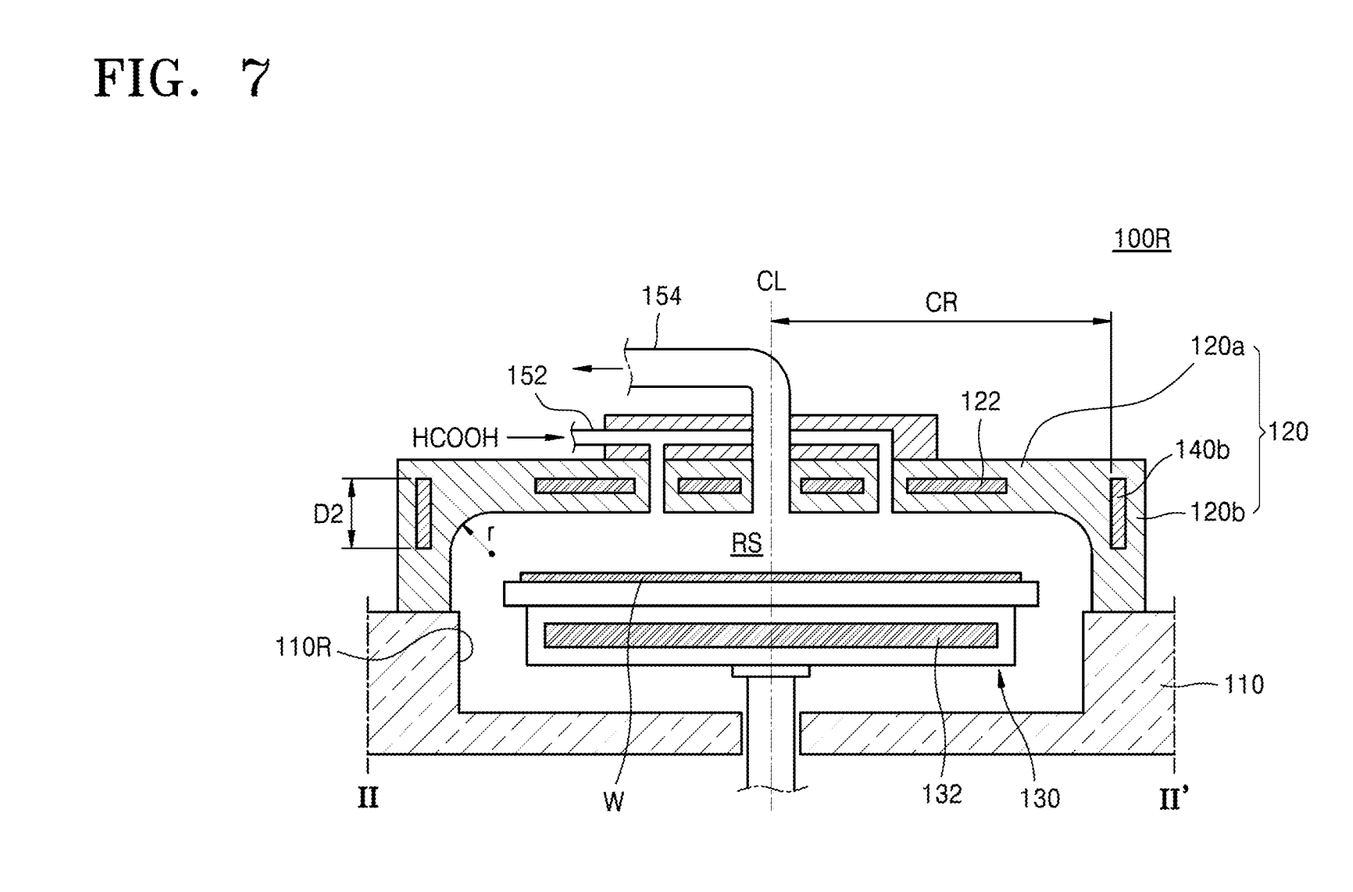
FIG. 7 is a schematic view illustrating a cross-sectional surface of a reflow region of an apparatus for manufacturing a solder bump, according to another example embodiment.

FIG. 7 is a schematic view illustrating a cross-sectional surface of a reflow region 100R of a solder bump reflow apparatus according to another example embodiment. Comparing with the reflow region illustrated in FIG. 2, the reflow region 100R illustrated in FIG. 7 may have a difference in only a cross-sectional shape of an edge heating zone, and the other configuration may be the same. Hereinafter, therefore, such a difference will be mainly described.

Referring to FIG. 7, an edge heating zone may be provided as a vertical edge heating zone 140b, which extends in a direction substantially parallel to the top surface of the supporter 130 (or the substrate W), and may not include a portion extending in a direction substantially parallel to the top surface of the supporter 130 (or the substrate W). Therefore, the vertical edge heating zone 140b may be disposed in a second portion 120b.

In the example embodiments of FIGS. 6 and 7, the horizontal edge heating zone 140a and the vertical edge heating zone 140b may have different heating characteristics. For example, comparing with the vertical edge heating zone 140b of FIG. 7, the horizontal edge heating zone 140a of FIG. 6 may be better in characteristic of decreasing deposition of an organic metal compound, and comparing with the horizontal edge heating zone 140a of FIG. 6, the vertical edge heating zone 140b of FIG. 7 may enable a stable reflow process because interference caused by a supporter heating part 132 or a central heating part 122 is small.

Figure 8:
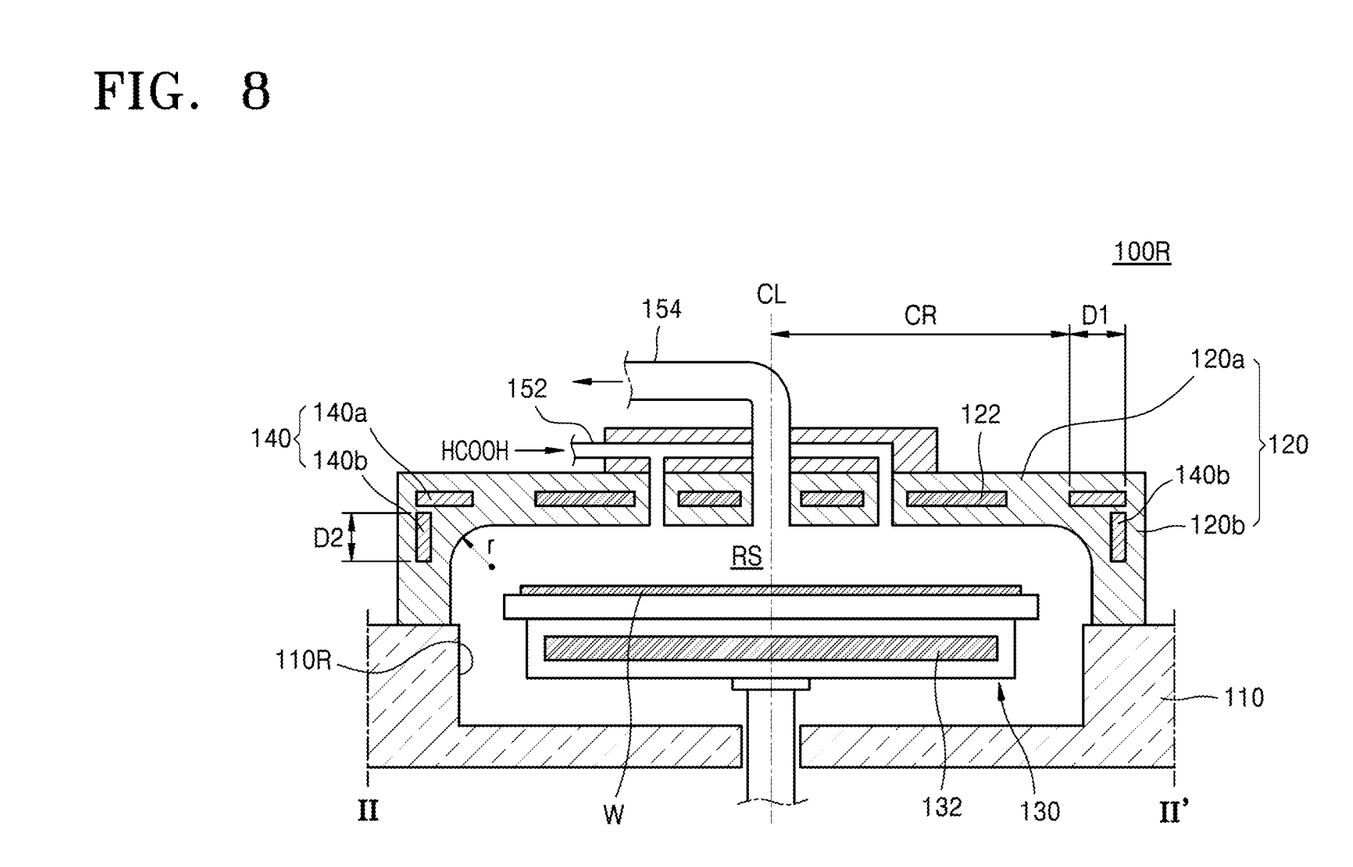
FIG. 8 is a schematic view illustrating a cross-sectional surface of a reflow region of an apparatus for manufacturing a solder bump, according to another example embodiment.

FIG. 8 is a schematic view illustrating a cross-sectional surface of a reflow region 100R of a solder bump reflow apparatus according to another example embodiment. Comparing with the reflow region illustrated in FIG. 2, the reflow region 100R illustrated in FIG. 8 may have a difference in only a configuration of an edge heating zone, and the other configuration may be the same. Hereinafter, therefore, such a difference will be mainly described.

Referring to FIG. 8, an edge heating zone 140 may include a horizontal edge heating zone 140a, which is in a first portion 120a and extends in a direction substantially parallel to the top surface of the supporter 130 (or the substrate W) in a first portion 120a, and a vertical edge heating zone 140b which is in a second portion 120b and extends in a direction substantially perpendicular to the top surface of the supporter 130 (or the substrate W). The horizontal edge heating zone 140a may be apart from the vertical edge heating zone 140b.

Because the horizontal edge heating zone 140a is apart from the vertical edge heating zone 140b, the horizontal edge heating zone 140a and the vertical edge heating zone 140b may be independently controlled. In some example embodiments, the horizontal edge heating zone 140a and the vertical edge heating zone 140b may be controlled to have different temperatures. A temperature of each of the horizontal edge heating zone 140a and the vertical edge heating zone 140b may be separately controlled so that a flow of gas based on convection is optimally maintained adjacent to the third inner surface 120S3.

Figure 9:
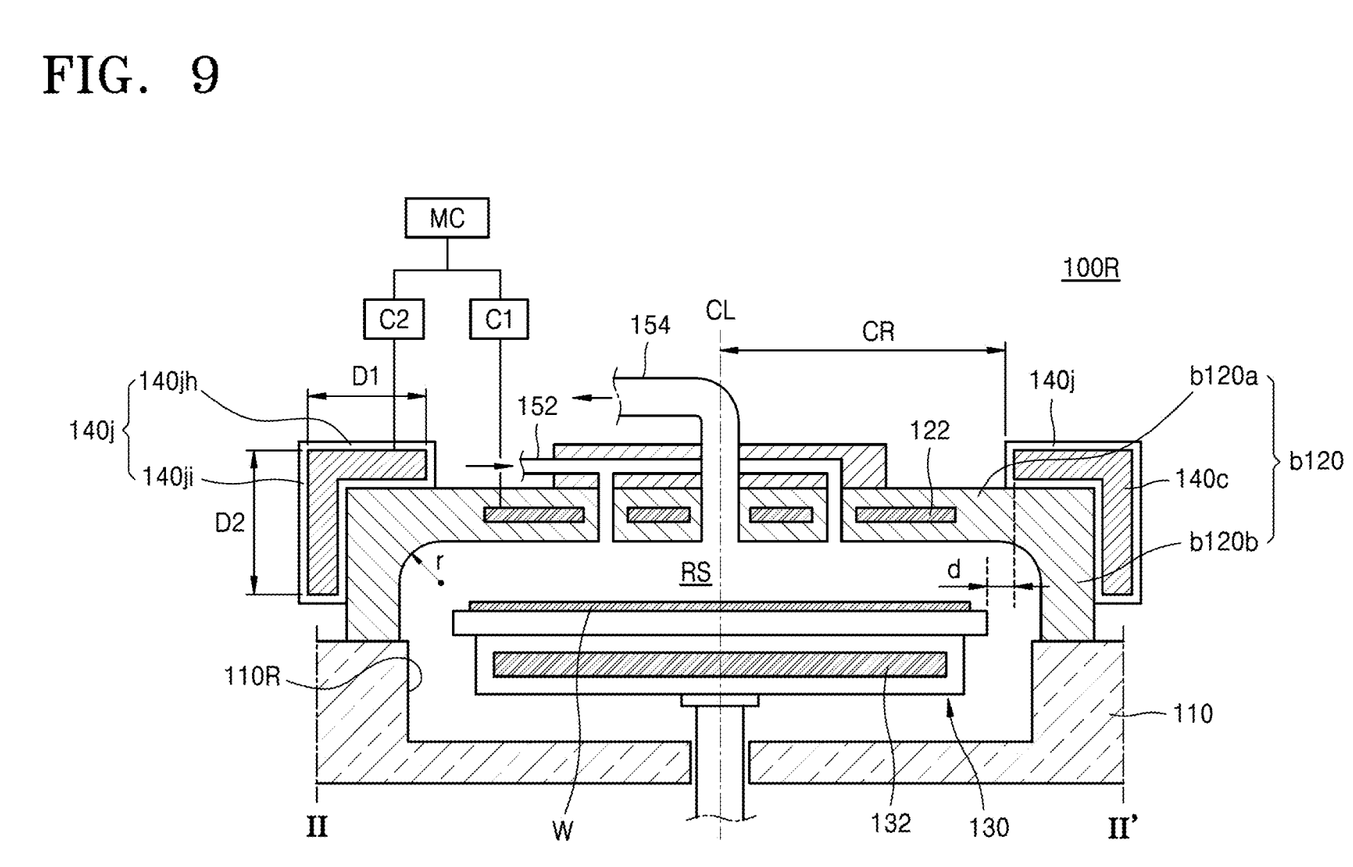
FIG. 9 is a schematic view illustrating a cross-sectional surface of a reflow region of an apparatus for manufacturing a solder bump, according to another example embodiment.

FIG. 9 is a schematic view illustrating a cross-sectional surface of a reflow region 100R of a solder bump reflow apparatus according to another example embodiment. Comparing with the reflow region illustrated in FIG. 2, the reflow region 100R illustrated in FIG. 9 may have a difference in only a configuration of an edge heating zone, and the other configuration may be the same. Hereinafter, therefore, such a difference will be mainly described.

Referring to FIG. 9, a heating jacket 140j including an edge heating zone 140c may be attached along a perimeter of a cover body part b120.

The cover body part b120 may include a horizontal extension portion b120a, which is substantially parallel to a surface (e.g., a top surface) of a substrate W to-be-processed (or the supporter 130), and a vertical extension portion b120b, which is substantially perpendicular to the surface (e.g., the top surface) of the substrate W to-be-processed (or the supporter 130). The horizontal extension portion b120a may correspond to the first portion 120a of the cover 120 of FIG. 2. The vertical extension portion b120b may correspond to the second portion 120b of the cover 120 of FIG. 2.

The edge heating zone 140c may be protected by the heating jacket 140j. For example, the heating jacket 140j may include a material having a strong heat resistance and electrical insulating properties like Teflon.

In some example embodiments, the heating jacket 140j may include a horizontal jacket portion 140jh which extends in contact with the horizontal extension portion b120a. In some example embodiments, the heating jacket 140j may be configured to include a vertical jacket portion 140ji, which extends in contact with the vertical extension portion b120b.

In FIG. 9, the edge heating zone 140c is illustrated as including the horizontal extension portion extending in the direction substantially parallel to the top surface of the substrate W or the supporter 130 and the vertical extension portion extending in the direction substantially perpendicular to the top surface of the substrate W or the supporter 130.

However, according to some example embodiments, the edge heating zone 140c may include only one of the horizontal extension portion and the perpendicular extension portion as in FIGS. 6 and 7.

Heat occurring in the edge heating zone 140c may be transferred to the cover body part b120 through the heating jacket 140j on the basis of conduction, and then, may be transferred to gas in the reflow space RS.

In some example embodiments, the heating jacket 140j may extend along a perimeter of the cover body part b120. In some example embodiments, the heating jacket 140j may not extend to the central region CR of the cover body part b120. A center heating part 122 may be provided in the central region CR of the cover body part b120. The central heating part 122 may supply heat for reflowing the substrate W from an upper portion of the substrate W. Furthermore, the central heating part 122 may facilitate discharging of a reaction product, which has been generated as a result of a reaction between an oxide remover and oxide, through a discharge nozzle 154.

Figure 10:
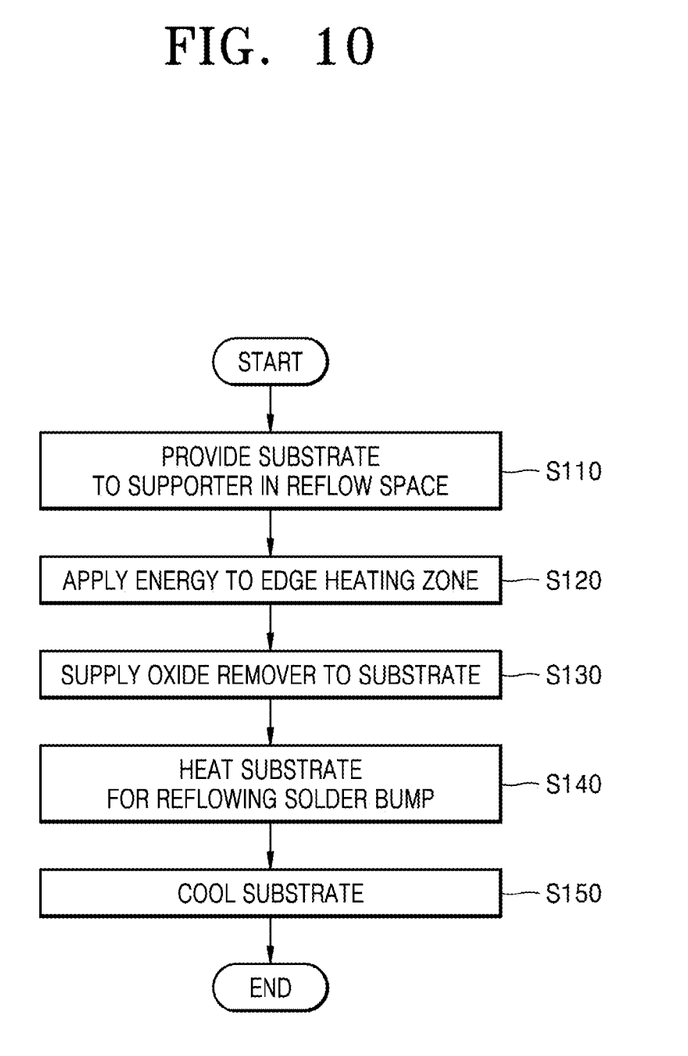
FIG. 10 is a flowchart illustrating a method of manufacturing a solder bump in sequence, according to an example embodiment.

FIG. 10 is a flowchart illustrating a method of reflowing a solder bump in sequence, according to an example embodiment.

Referring to FIG. 10 in conjunction with FIG. 2, a substrate W may be provided to a supporter 130 in a reflow space RS in operation S110. The substrate W may include a solder bump, which has not been reflowed and needs to be reflowed. For example, the solder bump may be a fluxless solder bump where flux is not used in a solder bump forming process. The substrate W may be loaded to and unloaded from the supporter 130 by, for example, robot arms 102 and 105, respectively (see FIG. 1).

Subsequently, energy may be applied to an edge heating zone 140 provided along a perimeter of a cover 120 in operation S120. Heat occurring in the edge heating zone 140 due to the applied energy may be transferred to the reflow space RS.

In operation S130, an oxide remover may be supplied to the substrate W. As described above, the oxide remover may remove native oxide formed in the solder bump. This has been described above in detail with reference to FIG. 4, and thus, its detailed description is omitted.

Subsequently, in operation S140, the substrate W may be heated for reflowing the solder bump. Here, heating of the substrate W may be performed by a supporter heating part 132 and/or a central heating part 122.

In some example embodiments, the supporter heating part 132 may heat the solder bump at about 220° C. to about 280° C., about 230° C. to about 270° C., or about 240° C. to about 260° C., for reflowing the solder bump. In some example embodiments, the central heating part 122 may heat the solder bump at about 220° C. to about 240° C., about 210° C. to about 250° C., or about 160° C. to about 200° C., for reflowing the solder bump.

Although it is illustrated in FIG. 10 that operation S120 of applying energy to the edge heating zone 140, operation S130 of supplying the oxide remover to the substrate W, and operation S140 of heating the substrate W are sequentially performed, but example embodiments of the present inventive concepts are not limited thereto. In some example embodiments, operation S120 of applying energy to the edge heating zone 140, operation S130 of supplying the oxide remover to the substrate W, and operation S140 of heating the substrate W may be performed in an arbitrary order, or one operation may be performed while another of the operations is being performed.

Subsequently, the substrate W may be cooled after reflow ends, and then, may be unloaded to an outside of the reflow space RS in operation S150.

By using the apparatuses and/or methods of manufacturing a solder bump according to the example embodiments, the amount of organic metal compound deposited therein may be reduced, and thus, product defects may decrease and a cleaning interval may increase, thereby enhancing productivity.

While the inventive concepts have been particularly shown and described with reference to the disclosed example embodiments thereof, it will be understood that various changes in form and details may be made therein without departing from the spirit and scope of the following claims.

What is claimed is:

1. A method of manufacturing a solder bump, the method comprising:
providing a substrate, comprising a solder bump which is not reflowed, to a supporter in a reflow space defined by a housing and a cover;
applying energy to an edge heating zone provided along a perimeter of the cover;
supplying an oxide remover to the substrate; and
heating a supporter heating part provided in the supporter, for reflowing the solder bump,
wherein the cover comprises a first portion substantially parallel to a main surface of the substrate and a second portion substantially vertical to the main surface of the substrate, and
the edge heating zone is provided in the first portion of the cover.

2. The method of claim 1, wherein
the applying of the energy overlaps the supplying of the oxide remover temporally.

3. The method of claim 2, wherein
a start time of the applying of the energy is earlier than a start time of the supplying of the oxide remover.

4. The method of claim 1, wherein
the edge heating zone is apart from the supporter in a planar view.

5. The method of claim 1, wherein
the heating of the supporter heating part comprises heating a central heating part provided in the first portion.

6. The method of claim 5, wherein
the central heating part is apart from the edge heating zone in a planar view.

7. The method of claim 1, wherein
the heating of the supporter heating part comprises discharging the oxide remover and a reaction product generated based on a reaction between the oxide remover and the oxide, to an outside of the reflow space.

8. The method of claim 1, wherein
the cover comprises a first portion substantially parallel to a main surface of the substrate and a second portion substantially vertical to the main surface of the substrate, and
the edge heating zone is provided in the second portion of the cover.

9. The method of claim 1, wherein
the cover is disposed at a portion higher than the housing, the cover comprises a cover body part and a heating jacket provided along a perimeter of the cover body part independently from the cover body part, and
the edge heating zone is provided in the heating jacket.

10. A method of manufacturing a solder bump, the method comprising:
providing a substrate to, comprising a solder bump which is not reflowed, to a supporter in a reflow space defined by a housing and a cover;
applying energy to an edge heating zone provided along a perimeter of the cover;
supplying an oxide remover to the substrate; and
heating the substrate for reflowing the solder bump,
wherein the edge heating zone is apart from the supporter by a first interval in a planar view,
the cover comprises a first portion substantially parallel to a main surface of the substrate and a second portion substantially vertical to the main surface of the substrate,
the first portion comprises a first inner surface facing the reflow space,
the second portion comprises a second inner surface facing the reflow space, and
the first inner surface and the second inner surface are connected to each other with a curve surface, which has a first curvature radius, therebetween.

11. The method of claim 10, wherein
the first curvature radius is about 5 mm to about 27 mm.

12. The method of claim 10, wherein
the cover comprises a first portion substantially parallel to a main surface of the substrate and a second portion substantially vertical to the main surface of the substrate, and
the heating of the substrate comprises heating a supporter heating part provided in the supporter and heating a central heating part provided in the first portion.

13. The method of claim 10, wherein
a temperature of the edge heating zone is controlled so that, when the edge heating zone operates, a temperature of gas adjacent to the curve surface increases by about 20° C. to about 50° C. compared to a case where the edge heating zone does not operate.

14. The method of claim 10, wherein
the oxide remover includes formic acid.

15. A method of manufacturing a solder bump, the method comprising:
providing a substrate, comprising a solder bump which is not reflowed, to a supporter in a reflow space defined by a housing and a cover;
applying energy to an edge heating zone provided along a perimeter of the cover;
supplying an oxide remover to the substrate; and
heating a supporter heating part provided in the supporter and a central heating part provide in the cover, for reflowing the solder bump,
wherein the edge heating zone is apart from the central heating part in a planar view,
the cover comprises a first portion substantially parallel to a main surface of the substrate and a second portion substantially vertical to the main surface of the substrate, and
the edge heating zone is provided in the first portion of the cover.

16. The method of claim 15, wherein
the applying of the energy overlaps the supplying of the oxide remover temporally.

17. The method of claim 15, wherein
a start time of the applying of the energy is earlier than a start time of the supplying of the oxide remover.

18. The method of claim 15, wherein
the heating of the supporter heating part and the central heating part comprises discharging the oxide remover and a reaction product generated based on a reaction between the oxide remover and the oxide, to an outside of the reflow space.

* * * * *